United States Patent
Tamamushi (10) Patent No.: US 12,476,080 B2
(45) Date of Patent: Nov. 18, 2025

(54) PLASMA PROCESSING APPARATUS, POWER SUPPLY SYSTEM, CONTROL METHOD, PROGRAM, AND STORAGE MEDIUM

(71) Applicant: Tokyo Electron Limited, Tokyo (JP)

(72) Inventor: Gen Tamamushi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 68 days.

(21) Appl. No.: 18/607,327

(22) Filed: Mar. 15, 2024

(65) Prior Publication Data

US 2024/0222078 A1 Jul. 4, 2024

Related U.S. Application Data

(63) Continuation of application No. PCT/JP2022/041985, filed on Nov. 10, 2022.

(30) Foreign Application Priority Data

Nov. 19, 2021 (JP) .................. 2021-188303

(51) Int. Cl.
*H01J 37/32* (2006.01)

(52) U.S. Cl.
CPC .. *H01J 37/32155* (2013.01); *H01J 37/32091* (2013.01); *H01J 37/32926* (2013.01); *H01J 37/3299* (2013.01); *H01J 2237/24564* (2013.01)

(58) Field of Classification Search
None
See application file for complete search history.

(56) References Cited

U.S. PATENT DOCUMENTS 11,875,968 B2 * 1/2024 Takahara .......... H01J 37/32174

OTHER PUBLICATIONS

Japanese Unexamined Patent Application Publication No. 2009-246091.

* cited by examiner

*Primary Examiner* — Kenneth B Wells
(74) *Attorney, Agent, or Firm* — XSENSUS LLP (57) ABSTRACT

In a plasma processing apparatus, electrical bias energy is provided from a bias power supply to a substrate support. Source radio-frequency power is provided from a radio-frequency power supply to a radio-frequency electrode through a feed line. A phase period having a minimum value of a power level of a reflected wave of the source radio-frequency power is identified from a plurality of phase periods in a bias cycle of the electrical bias energy. A reference value being a phase difference between a voltage and a current on the feed line in the identified phase period is determined. A source frequency of the source radio-frequency power is controlled for each phase period based on a result of comparison between the reference value and the phase difference between the voltage and the current on the feed line in a corresponding phase period of the plurality of phase periods.

20 Claims, 6 Drawing Sheets

PLASMA PROCESSING APPARATUS, POWER SUPPLY SYSTEM, CONTROL METHOD, PROGRAM, AND STORAGE MEDIUM

CROSS REFERENCE TO RELATED APPLICATION

This application is a bypass continuation application if International Application No. PCT/JP2022/041985, having an international filing date of Nov. 10, 2022, and designating the United States, the international application being based upon and claiming the benefit of priority from Japanese Patent Application No. 2021-188303, filed on Nov. 19, 2021, the entire contents of each are incorporated herein by reference.

FIELD

Exemplary embodiments of the disclosure relate to a plasma processing apparatus, a power supply system, a control method, a program, and a storage medium.

BACKGROUND

A plasma processing apparatus is used to perform plasma processing on substrates. The plasma processing apparatus uses bias radio-frequency power to draw ions in plasma generated in a chamber to a substrate. Patent Literature 1 below describes a plasma processing apparatus that modulates the power level and the frequency of bias radio-frequency power.

CITATION LIST

Patent Literature

Patent Literature 1: Japanese Unexamined Patent Application Publication No. 2009-246091

SUMMARY

Technical Problem

One or more aspects of the disclosure are directed to a technique for reducing the power level of a reflected wave of source radio-frequency power.

Solution to Problem

A plasma processing apparatus according to one exemplary embodiment includes a chamber, a substrate support, a bias power supply, a radio-frequency power supply, a first sensor, and a second sensor. The substrate support is in the chamber. The bias power supply is electrically coupled to the substrate support to generate electrical bias energy. The electrical bias energy has a bias frequency and is cyclically generated in bias cycles each having a duration being an inverse of the bias frequency. The radio-frequency power supply is electrically coupled to a radio-frequency electrode to generate source radio-frequency power to generate plasma from a gas in the chamber. The first sensor measures a power level of a reflected wave of the source radio-frequency power from a load. The second sensor measures a voltage and a current on a feed line coupling the radio-frequency power supply and the radio-frequency electrode. The radio-frequency power supply identifies, from a plurality of phase periods in a bias cycle of the electrical bias energy, a phase period having a minimum value of the power level of the reflected wave. The radio-frequency power supply determines a reference value being a phase difference between the voltage and the current on the feed line in the identified phase period. The radio-frequency power supply performs frequency control to set a source frequency of the source radio-frequency power for each of the plurality of phase periods based on a result of comparison between the reference value and the phase difference between the voltage and the current on the feed line in a corresponding phase period of the plurality of phase periods.

Advantageous Effects

The technique according to the above exemplary embodiment reduces the power level of the reflected wave of the source radio-frequency power.

DETAILED DESCRIPTION

Exemplary embodiments will now be described in detail with reference to the drawings. In the figures, like reference numerals denote like or corresponding components.

Figure 1:
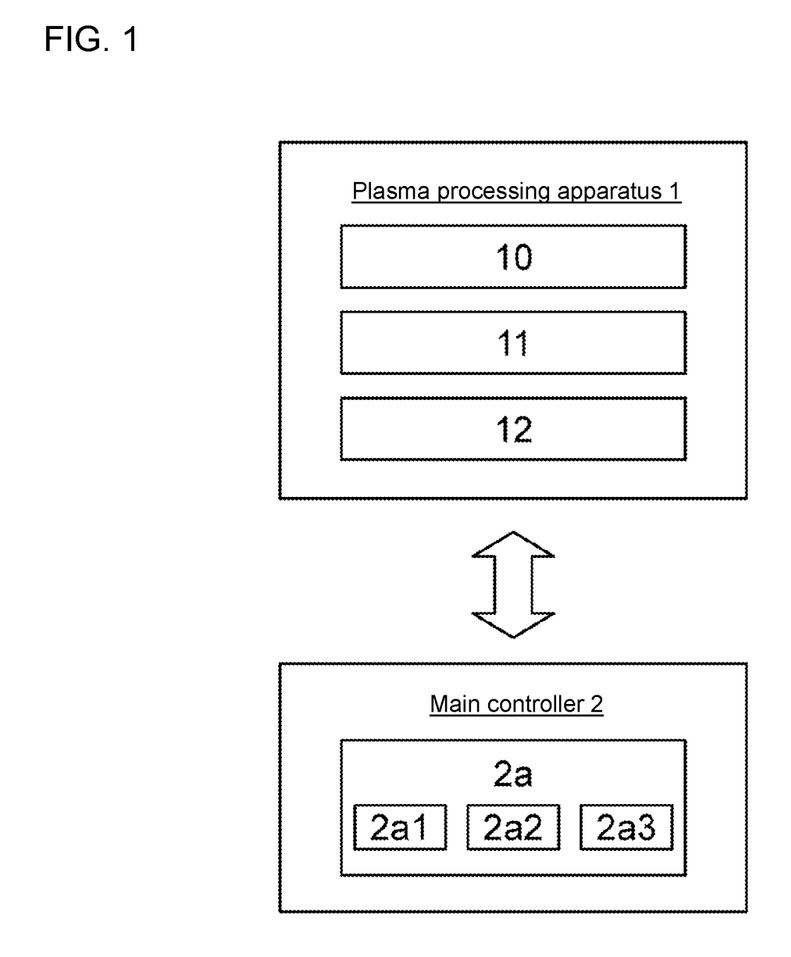
FIG. 1 is a diagram of a plasma processing system with an example structure.

FIG. 1 is a diagram of a plasma processing system with an example structure. In one embodiment, the plasma processing system includes a plasma processing apparatus 1 and a main controller 2. The plasma processing system is an example of a substrate processing system. The plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. The plasma processing chamber 10 has at least one gas inlet for receiving at least one process gas supplied into the plasma processing space and at least one gas outlet for discharging the gas from the plasma processing space. The gas inlet is connected to a gas supply 20 (described later). The gas outlet is connected to an exhaust system 40 (described later). The substrate support 11 is located in the plasma processing space and has a substrate support surface for supporting a substrate.

The plasma generator 12 generates plasma from at least one process gas supplied into the plasma processing space. The plasma generated in the plasma processing space may be, for example, capacitively coupled plasma (CCP), inductively coupled plasma (ICP), electron cyclotron resonance (ECR) plasma, helicon wave plasma (HWP), or surface wave plasma (SWP).

The main controller 2 processes computer-executable instructions that cause the plasma processing apparatus 1 to perform various steps described in one or more embodiments of the disclosure. The main controller 2 may control the components of the plasma processing apparatus 1 to perform the various steps described herein. In one embodiment, some or all of the components of the main controller 2 may be included in the plasma processing apparatus 1. The main controller 2 may include a processor 2a1, a storage 2a2, and a communication interface 2a3. The main controller 2 is implemented by, for example, a computer 2a. The processor 2a1 may perform various control operations by loading a program from the storage 2a2 and executing the loaded program. The program includes computer-executable instructions that cause the plasma processing apparatus 1 to perform various steps included in a control method according to an exemplary embodiment (described later). The program may be prestored in the storage 2a2 or may be obtained through a medium as appropriate. The obtained program is stored into the storage 2a2 to be loaded from the storage 2a2 and executed by the processor 2a1. The medium may be one of various storage media readable by the computer 2a, or a communication line connected to the communication interface 2a3. The processor 2a1 may be a central processing unit (CPU). The storage 2a2 may include a random-access memory (RAM), a read-only memory (ROM), a hard disk drive (HDD), a solid-state drive (SSD), or a combination of these. The communication interface 2a3 may communicate with the plasma processing apparatus 1 through a communication line such as a local area network (LAN).

Figure 2:
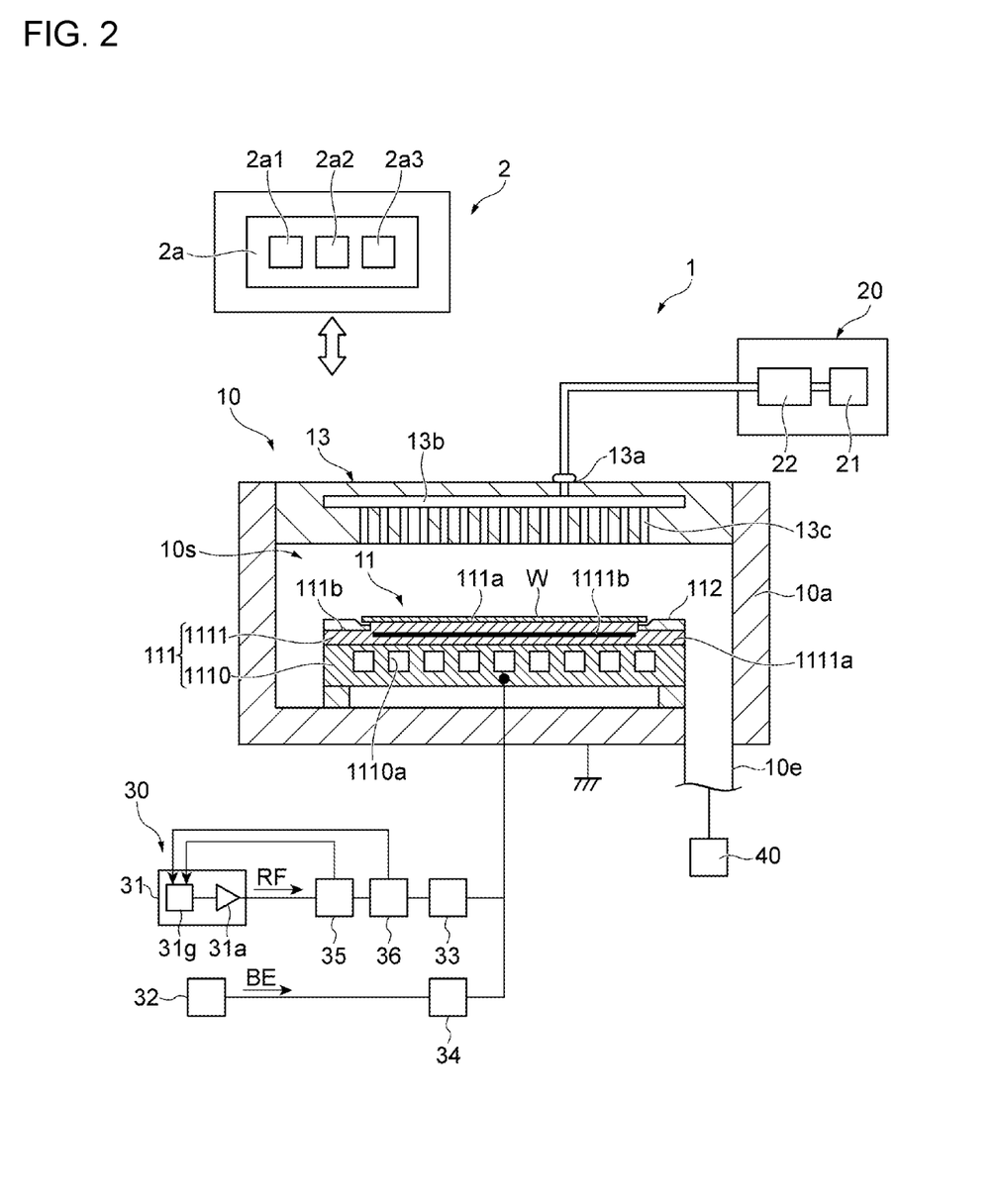
FIG. 2 is a diagram of a capacitively coupled plasma processing apparatus with an example structure.

An example structure of a capacitively coupled plasma processing apparatus as an example of the plasma processing apparatus 1 will now be described. FIG. 2 is a diagram of the capacitively coupled plasma processing apparatus with the structure.

The capacitively coupled plasma processing apparatus 1 includes the plasma processing chamber 10, the gas supply 20, a power supply system 30, and the exhaust system 40. The plasma processing apparatus 1 also includes the substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10s defined by the shower head 13, a side wall 10a of the plasma processing chamber 10, and the substrate support 11. The plasma processing chamber 10 is grounded. The shower head 13 and the substrate support 11 are electrically insulated from the housing of the plasma processing chamber 10.

The substrate support 11 includes a body 111 and a ring assembly 112. The body 111 includes a central portion 111a for supporting a substrate W and an annular portion 111b for supporting the ring assembly 112. The substrate W is, for example, a wafer. The annular portion 111b of the body 111 surrounds the central portion 111a of the body 111 as viewed in plan. The substrate W is placed on the central portion 111a of the body 111. The ring assembly 112 is placed on the annular portion 111b of the body 111 to surround the substrate W on the central portion 111a of the body 111. Thus, the central portion 111a is also referred to as a substrate support surface for supporting the substrate W. The annular portion 111b is also referred to as a ring support surface for supporting the ring assembly 112.

In one embodiment, the body 111 includes a base 1110 and an electrostatic chuck (ESC) 1111. The base 1110 includes a conductive member. The ESC 1111 is located on the base 1110. The ESC 1111 includes a ceramic member 1111a and an electrostatic electrode 1111b inside the ceramic member 1111a. The ceramic member 1111a includes the central portion 111a. In one embodiment, the ceramic member 1111a also includes the annular portion 111b. The annular portion 111b may be included in a separate member surrounding the ESC 1111, such as an annular ESC or an annular insulating member. In this case, the ring assembly 112 may be located on the annular ESC or the annular insulating member, or may be located on both the ESC 1111 and the annular insulating member.

The ring assembly 112 includes one or more annular members. In one embodiment, one or more annular members include one or more edge rings and at least one cover ring. The edge ring is formed from a conductive material or an insulating material. The cover ring is formed from an insulating material.

The substrate support 11 may also include a temperature control module that adjusts the temperature of at least one of the ESC 1111, the ring assembly 112, or the substrate to a target temperature. The temperature control module may include a heater, a heat transfer medium, a channel 1110a, or a combination of these. The channel 1110a allows a flow of a heat transfer fluid such as brine or gas through it. In one embodiment, the channel 1110a is defined in the base 1110, and one or more heaters are located in the ceramic member 1111a in the ESC 1111. The substrate support 11 may include a heat transfer gas supply to supply a heat transfer gas into a space between the back surface of the substrate W and the central portion 111a.

The shower head 13 introduces at least one process gas from the gas supply 20 into the plasma processing space 10s. The shower head 13 has at least one gas inlet 13a, at least one gas-diffusion compartment 13b, and multiple gas guides 13c. The process gas supplied to the gas inlet 13a passes through the gas-diffusion compartment 13b and is introduced into the plasma processing space 10s through the multiple gas guides 13c. The shower head 13 also includes at least one upper electrode. In addition to the shower head 13, the gas inlet unit may include one or more side gas injectors (SGIs) installed in one or more openings in the side wall 10a.

The gas supply 20 may include at least one gas source 21 and at least one flow controller 22. In one embodiment, the gas supply 20 allows supply of at least one process gas from the corresponding gas source 21 to the shower head 13 through the corresponding flow controller 22. The flow controller 22 may include, for example, a mass flow controller or a pressure-based flow controller. The gas supply 20 may further include at least one flow rate modulator that allows supply of at least one process gas at a modulated flow rate or in a pulsed manner.

The exhaust system 40 is connectable to, for example, a gas outlet 10e in the bottom of the plasma processing chamber 10. The exhaust system 40 may include a pressure control valve and a vacuum pump. The pressure control valve regulates the pressure in the plasma processing space 10s. The vacuum pump may include a turbomolecular pump, a dry pump, or a combination of these.

The power supply system 30 includes a radio-frequency (RF) power supply 31 and a bias power supply 32. The RF power supply 31 serves as the plasma generator 12 in one embodiment. The RF power supply 31 generates source radio-frequency power RF. The source radio-frequency power RF has a source frequency $f_{RF}$. More specifically, the source radio-frequency power RF has a sinusoidal waveform with its frequency being the source frequency $f_{RF}$. The source frequency $f_{RF}$ may be within a range of 10 to 150 MHz. The RF power supply 31 is electrically coupled to an RF electrode through a matcher 33 to provide the source radio-frequency power RF to the RF electrode. The RF electrode may be the conductive member in the base 1110, may be at least one electrode in the ceramic member 1111a, or may be the upper electrode. The matcher 33 has a variable impedance that is set to reduce reflection of the source radio-frequency power RF from a load. In response to the source radio-frequency power RF provided to the RF electrode, plasma is generated from the gas in the chamber 10.

The bias power supply 32 generates electrical bias energy BE. The bias power supply 32 is electrically coupled to the substrate support 11. The bias power supply 32 is electrically coupled to a bias electrode in the substrate support 11 to provide the electrical bias energy BE to the bias electrode. The bias electrode may be the conductive member in the base 1110 or may be at least one electrode in the ceramic member 1111a. The electrical bias energy BE provided to the bias electrode attracts ions in the plasma to the substrate W.

The electrical bias energy BE has a bias frequency. The bias frequency is lower than the source frequency. The bias frequency may be within a range of 100 kHz to 60 MHz, or for example, 400 kHz. The electrical bias energy BE is cyclically provided to the bias electrode in bias cycles (at time intervals), or waveform cycles (cycles CY), each having a duration being the inverse of the bias frequency.

Figure 3:
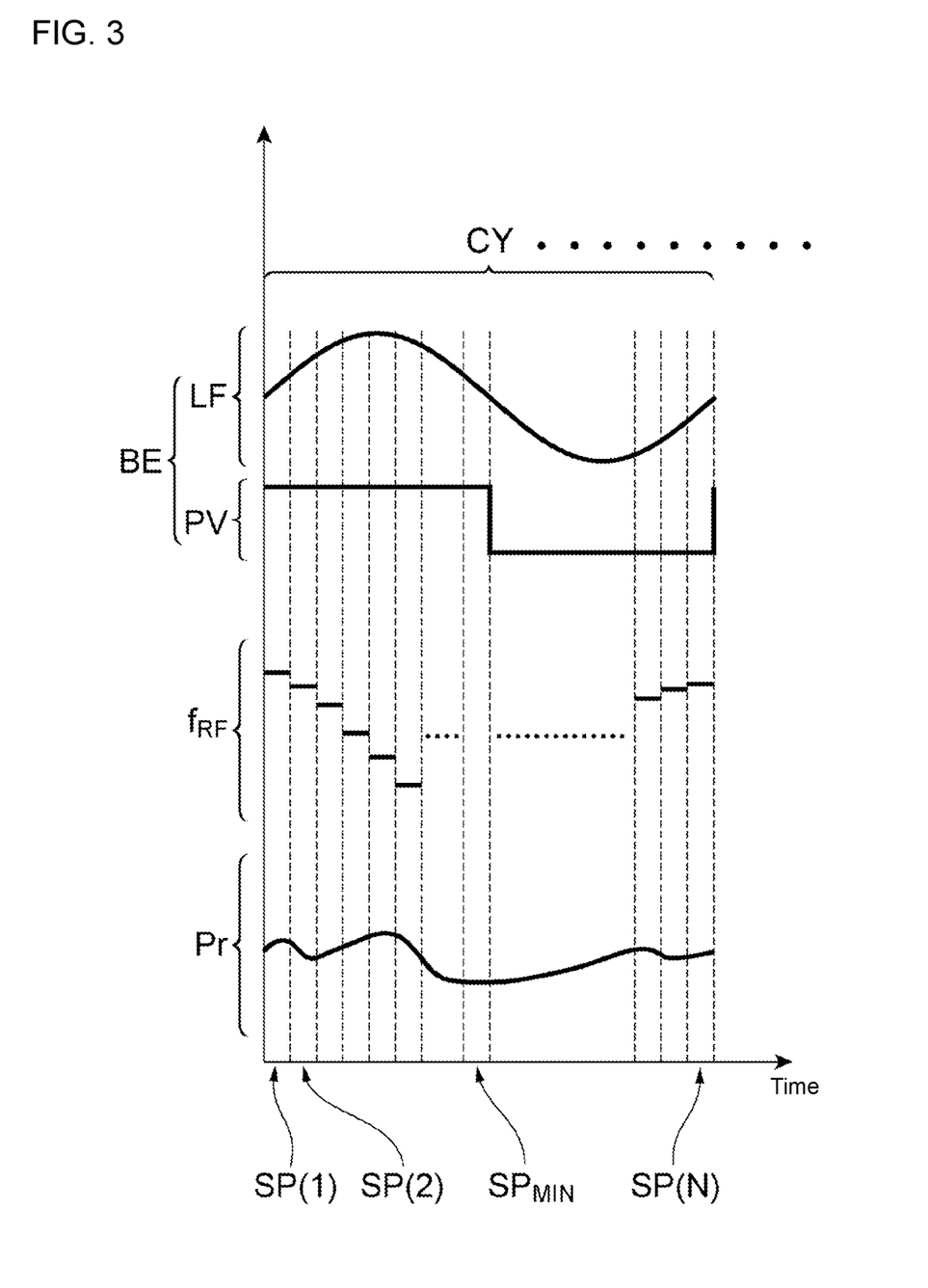
FIG. 3 is a timing chart for the plasma processing apparatus according to one exemplary embodiment.

FIG. 3 will now be referred to in addition to FIG. 2. FIG. 3 is a timing chart for the plasma processing apparatus according to one exemplary embodiment. The electrical bias energy BE may be bias RF power LF having the bias frequency. In other words, the electrical bias energy BE may have a sinusoidal waveform with its frequency being the bias frequency. In this case, the bias power supply 32 is electrically coupled to the bias electrode through a matcher 34. The matcher 34 has a variable impedance that is set to reduce reflection of the bias RF power LF from the load.

In some embodiments, the electrical bias energy BE may include a pulse PV of a voltage. The waveform of the pulse PV of the electrical bias energy BE may be rectangular, triangular, or in any other shape. The pulse PV of the voltage of the electrical bias energy BE has polarity that causes a potential difference between the plasma and the substrate W to draw ions in the plasma to the substrate W. For example, the pulse PV of the electrical bias energy BE may be a pulse of a negative voltage. The pulse PV of the electrical bias energy BE may be a pulse of a direct current (DC) voltage from a DC power supply with its waveform shaped by a pulse unit. When the electrical bias energy BE is the pulse PV of the voltage, the matcher 34 may be eliminated.

The RF power supply 31 provides the source radio-frequency power RF in a period in which the cycle CY is repeated, or in other words, a period in which the electrical bias energy BE is cyclically provided. The RF power supply 31 generates the source radio-frequency power RF having the source frequency $f_{RF}$ that is set to reduce the reflected wave of the source radio-frequency power RF from the load in each of multiple phase periods SP in a cycle CY. The multiple phase periods SP are periods into which a cycle CY is divided. The source frequency $f_{RF}$ in each of the multiple phase periods SP in an initial cycle CY is predetermined. More specifically, a group of source frequencies $f_{RF}$ in the multiple phase periods SP in the initial cycle CY is predetermined. Determining the source frequency $f_{RF}$ in each of the multiple phase periods SP in the initial cycle CY will be described in detail later.

The RF power supply 31 is synchronized with the bias power supply 32 using a synchronization signal to set the source frequency $f_{RF}$ for each of the multiple phase periods SP. The synchronization signal may be provided from the RF power supply 31 to the bias power supply 32 or from the bias power supply 32 to the RF power supply 31. In some embodiments, the synchronization signal may be provided from another device to the RF power supply 31 and the bias power supply 32.

As shown in FIG. 2, the plasma processing apparatus 1 further includes a sensor 35 (first sensor) and a sensor 36 (second sensor). The sensor 35 measures a power level Pr of the reflected wave of the source radio-frequency power RF from the load. The sensor 35 includes, for example, a directional coupler. The directional coupler may be located between the RF power supply 31 and the matcher 33. The sensor 35 may also measure a power level Pf of the traveling wave of the source radio-frequency power RF. The sensor 35 notifies the RF power supply 31 of the measured power level Pr of the reflected wave. The sensor 35 may also notify the RF power supply 31 of the power level Pf of the traveling wave.

The sensor 36 includes a voltage sensor and a current sensor. The sensor 36 measures a voltage $V_{RF}$ and a current $I_{RF}$ on a feed line coupling the RF power supply 31 and the RF electrode. The source radio-frequency power RF is provided to the RF electrode through the feed line. The sensor 36 may be located between the RF power supply 31 and the matcher 33. The RF power supply 31 is notified of the voltage $V_{RF}$ and the current $I_{RF}$ on the feed line.

The RF power supply 31 identifies, from the multiple phase periods SP in a cycle CY, a phase period $SP_{MIN}$ (refer to FIG. 3) having a minimum value of the power level Pr of the reflected wave. The RF power supply 31 then determines a reference value Φ being the phase difference between the voltage $V_{RF}$ and the current $I_{RF}$ in the phase period $SP_{MIN}$. The RF power supply 31 then performs frequency control for each of the multiple phase periods SP, or in other words, sets the source frequency $f_{RF}$ for each of the multiple phase periods SP, based on the result of comparison between the reference value Φ and the phase difference θ between the voltage $V_{RF}$ and the current $I_{RF}$ in the corresponding phase period.

In one embodiment, the frequency control may increase the source frequency $f_{RF}$ when the phase difference θ between the voltage $V_{RF}$ and the current $I_{RF}$ is greater than the reference value Φ in each of the multiple phase periods SP. More specifically, the frequency control may change the source frequency $f_{RF}$ to a frequency $f_{RF}+\Delta f$ when the phase difference θ between the voltage $V_{RF}$ and the current $I_{RF}$ is greater than the reference value Φ in each of the multiple phase periods SP. The frequency control may decrease the source frequency $f_{RF}$ when the phase difference θ is less than the reference value Φ. More specifically, the frequency control may change the source frequency $f_{RF}$ to a frequency $f_{RF}-\Delta f$ when the phase difference θ between the voltage $V_{RF}$ and the current $I_{RF}$ is less than the reference value Φ in each of the multiple phase periods SP.

In one embodiment, the RF power supply 31 may adjust the source frequency $f_{RF}$ through the frequency control by an adjustment amount Δf being a predetermined fixed value in each of the multiple phase periods SP. In some embodiments, the RF power supply 31 may adjust the source frequency $f_{RF}$ through the frequency control by an adjustment amount Δf determined based on the absolute value of the difference between the reference value Φ and the phase difference θ in each of the multiple phase periods SP. More specifically, the RF power supply may perform frequency control to adjust the source frequency $f_{RF}$ by a greater adjustment amount Δf for a greater absolute value of the difference between the reference value Φ and the phase difference θ.

In one embodiment, the RF power supply 31 may perform the above frequency control when the power level Pr of the reflected wave is greater than a threshold Pth in each of the multiple phase periods SP. The RF power supply 31 may decrease the threshold Pth when the power levels Pr of the reflected wave in the respective multiple phase periods SP are all less than or equal to the threshold Pth in a cycle CY. The threshold Pth is decreased to a threshold Pth−ΔPth. The threshold Pth is decreased by a decrease amount ΔPth that may be predetermined. The RF power supply 31 may decrease the threshold Pth when the power levels Pr of the reflected wave in the respective phase periods SP are all less than or equal to the threshold Pth in two or more consecutive cycles CY.

In one embodiment, the RF power supply 31 may include a signal generator 31g and an amplifier 31a. The signal generator 31g generates an RF signal. The amplifier 31a amplifies the RF signal from the signal generator 31g to generate the source radio-frequency power RF. The above synchronization signal may be provided from the signal generator 31g to the bias power supply 32.

The signal generator 31g initially generates an RF signal having the source frequency $f_{RF}$ predetermined for each of the multiple phase periods SP. The signal generator 31g identifies the phase period $SP_{MIN}$, determines the reference value Φ, and generates an RF signal having the source frequency $f_{RF}$ adjusted through the above frequency control for each of the multiple phase periods SP.

In one embodiment, the signal generator 31g may include a processor and a digital-to-analog (D/A) converter. The signal generator 31g may convert a digital signal output from the processor to an RF signal, or an analog signal, with the D/A converter. The processor in the signal generator 31g may identify the phase period $SP_{MIN}$, determine the reference value Φ, and generate a digital signal having the source frequency $f_{RF}$ adjusted through the above frequency control for each of the multiple phase periods SP.

In the plasma processing apparatus 1, the reference value Φ is determined to be the phase difference between the voltage $V_{RF}$ and the current $I_{RF}$ in the phase period $SP_{MIN}$ having the minimum value of the power level Pr of the reflected wave. In other words, the reference value Φ is determined to be the phase difference corresponding to the lowest level of the reflected wave that may contain intermodulation distortion components or harmonic components. In each of the multiple phase periods SP, the source frequency $f_{RF}$ is adjusted based on the result of comparison between the reference value Φ and the phase difference θ between the voltage $V_{RF}$ and the current $I_{RF}$. This reduces the power level of the reflected wave of the source radio-frequency power RF.

Figure 4:
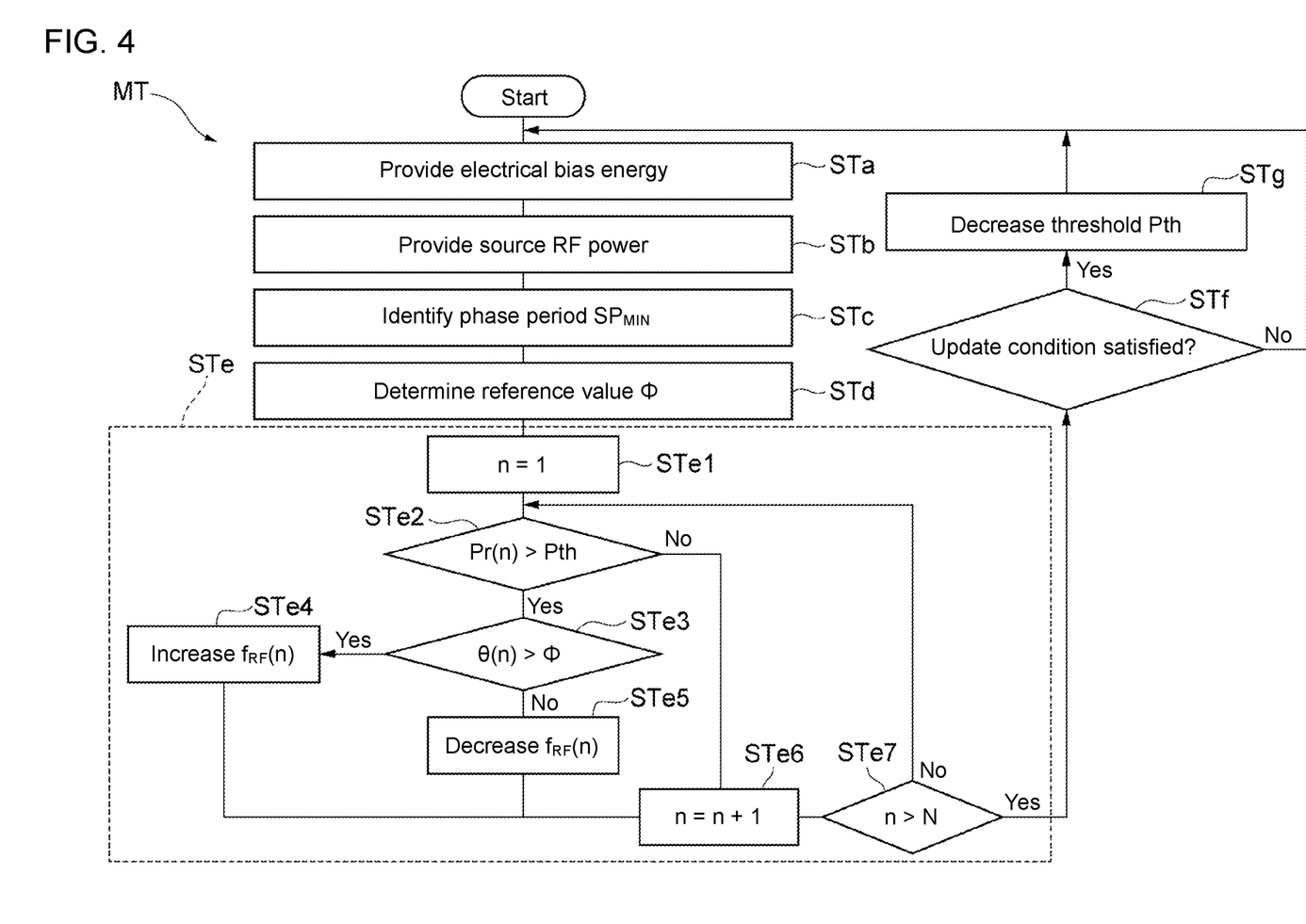
FIG. 4 is a flowchart of a control method according to one exemplary embodiment.

FIG. 4 will now be referred to. FIG. 4 is a flowchart of a control method according to one exemplary embodiment. The control method shown in FIG. 4 (hereafter referred to as a method MT) may be performed with the plasma processing apparatus 1.

The method MT starts from step STa. In step STa, the electrical bias energy BE is provided from the bias power supply 32 to the substrate support 11. The electrical bias energy BE is cyclically provided in cycles CY.

Step STb is performed while the electrical bias energy BE is being provided to the substrate support 11 in step STa. In step STb, the source radio-frequency power RF is provided from the RF power supply 31 to the RF electrode to generate plasma from the gas in the chamber 10. The initial source frequency RF of the source radio-frequency power RF in each of the multiple phase periods SP is predetermined as described above.

In step STc, the phase period $SP_{MIN}$ is identified as described above. In step STd, the reference value Φ is determined as described above.

In step STe, the frequency control is performed for each of the multiple phase periods SP based on the result of comparison between the reference value Φ and the phase difference θ between the voltage $V_{RF}$ and the current $I_{RF}$ in the corresponding phase period. More specifically, the source frequency $f_{RF}$ of the source radio-frequency power RF is set for each of the multiple phase periods SP based on the result of comparison between the reference value Φ and the phase difference θ in the corresponding phase period SP. As described above, the frequency control may increase the source frequency $f_{RF}$ when the phase difference θ is greater than the reference value Φ and decrease the source frequency $f_{RF}$ when the phase difference θ is less than the reference value Φ in each of the multiple phase periods SP.

In one embodiment, step STe may include steps STe1 to STe7 as shown in FIG. 4. In step STe1, n is set to 1. In step STe2, the determination is performed as to whether a power level Pr(n) of the reflected wave is greater than the threshold Pth. The symbol Pr(n) indicates the power level Pr of the reflected wave in the n-th phase period SP(n) of the multiple phase periods SP in a cycle CY.

When the power level Pr(n) of the reflected wave is less than or equal to the threshold Pth in step STe2, the processing advances to step STe6. When the power level Pr(n) of the reflected wave is greater than the threshold Pth in step STe2, the processing advances to step STe3. The method MT may eliminate step STe2.

In step STe3, the determination is performed as to whether the phase difference θ(n) is greater than the reference value Φ. The symbol θ(n) indicates the phase difference θ between the voltage $V_{RF}$ and the current $I_{RF}$ in the n-th phase period SP(n) of the multiple phase periods SP in a cycle CY.

When the phase difference θ(n) is greater than the reference value Φ in step STe3, a source frequency $f_{RF}$(n) is increased in step STe4. The symbol $f_{RF}$(n) indicates the source frequency $f_{RF}$ for the n-th phase period SP(n) of the multiple phase periods SP in a cycle CY. When the phase difference θ(n) is less than the reference value Φ in step STe3, the source frequency $f_{RF}$(n) is decreased in step STe5.

In step STe6, n is incremented by 1. In step STe7, the determination is performed as to whether n is greater than N, where N is the number of phase periods SP in a cycle CY. When n is less than or equal to N, the processing in step STe2 and subsequent steps is repeated. When n is greater than N, the processing advances to step STf.

In step STf, the determination is performed as to whether an update condition is satisfied. The update condition is satisfied when the power levels Pr of the reflected wave in the respective multiple phase periods SP are all less than or equal to the threshold Pth in a cycle CY. The update condition may be satisfied when the power levels Pr of the reflected wave in the respective phase periods SP are all less than or equal to the threshold Pth in two or more consecutive cycles CY. When the update condition is satisfied, the threshold Pth is decreased in step STg.

When the update condition is not satisfied or after the threshold Pth is decreased in step STg, the processing advances to step STa. The method MT may eliminate steps STf and STg.

In step STa, the electrical bias energy is provided in the subsequent cycle CY. In step STb, the source radio-frequency power RF is provided in this cycle CY. In step STb, the source radio-frequency power RF having the source frequency $f_{RF}$ set in step STe is provided for each of the multiple phase periods SP. The processing in step STc and subsequent steps is repeated, until the method MT ends upon an end condition being satisfied. The end condition may be specified in recipe data.

Examples of determining the source frequency $f_{RF}$ in each of the multiple phase periods SP in the initial cycle CY will now be described. In the examples described below, the source frequency $f_{RF}$ is determined by the RF power supply 31 (e.g., or its processor). The source frequency $f_{RF}$ may be determined by the processor in the signal generator 31g. The source frequency $f_{RF}$ may be determined by another controller.

First Example of Determining Source Frequencies $f_{RF}$

Figure 5:
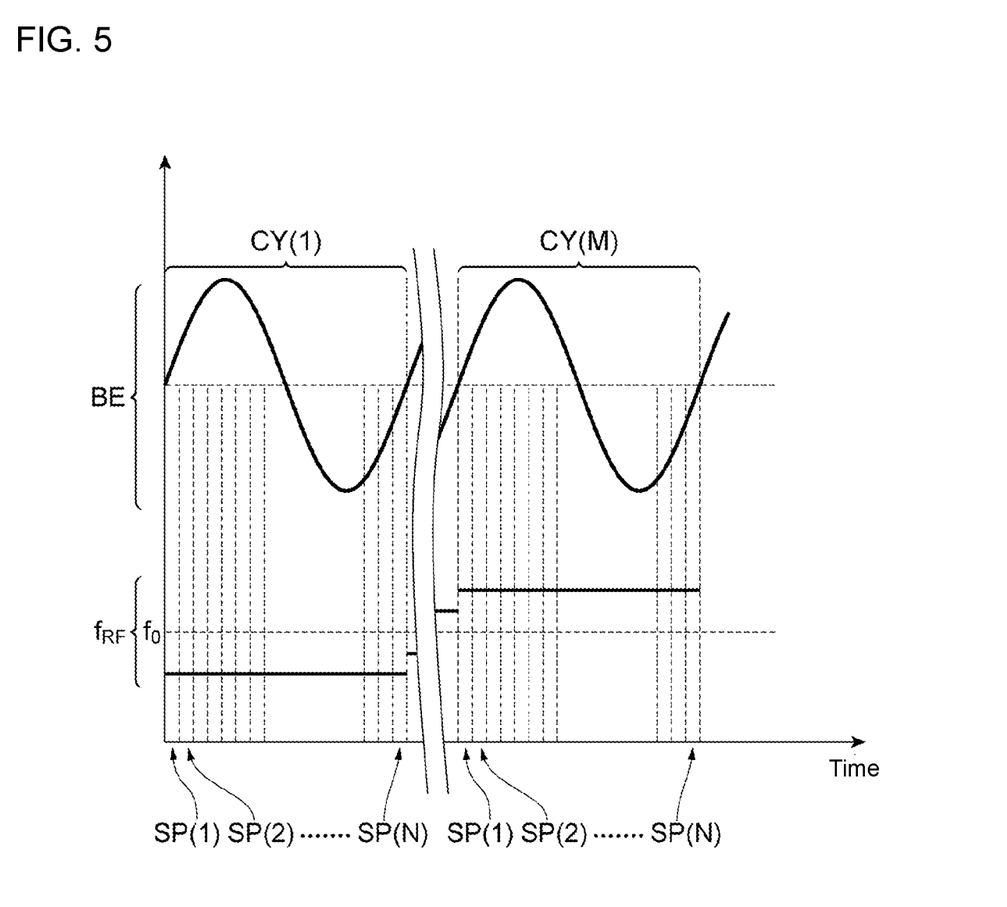
FIG. 5 is a timing chart for determining source frequencies in a first example.

FIG. 5 is a timing chart for determining source frequencies in a first example. In each of the examples described below, the source frequency $f_{RF}$ is adjusted in an overlap period in which the electrical bias energy BE and the source radio-frequency power RF are both provided. The overlap period includes multiple cycles CY, or specifically, M cycles CY(1) to CY(M) as shown in FIG. 5. Each of the multiple cycles CY includes multiple phase periods SP, or specifically, N phase periods SP(1) to SP(N). A phase period SP(n) herein refers to the n-th phase period of the phase periods SP(1) to SP(N). A phase period SP(m, n) refers to the n-th phase period SP(n) in the m-th cycle CY(m).

In the first example and a second example (described later), the RF power supply 31 generates a representative value RV of the measurement values in each of the multiple phase periods SP. The measurement values may be the power levels Pr of the reflected wave obtained by the sensor 35. The measurement values may be the ratios of the power levels Pr of the reflected wave to the output power level of the source radio-frequency power RF. The measurement values may be the phase differences between the voltages and the currents obtained by the sensor 36 in each of the multiple phase periods SP. The representative value RV may be the average or the maximum of the measurement values in each of the multiple phase periods SP. A representative value RV(n) herein refers to the representative value RV obtained in the n-th phase period SP(n) of the phase periods SP(1) to SP(N). A representative value RV (m, n) herein refers to the representative value RV obtained in the n-th phase period in the m-the cycle CY.

In the first example, the RF power supply 31 sets the source frequencies $f_{RF}$ of the source radio-frequency power RF in the identical phase periods SP(n) in multiple cycles CY to multiple different frequencies. The RF power supply 31 compares the representative values RV(n) obtained in the identical phase periods SP(n) in the multiple cycles CY with one another. The RF power supply 31 then selects, from the multiple frequencies, the frequency that minimizes reflection of the source radio-frequency power RF. For example, the RF power supply 31 selects the frequency that minimizes the power level Pr of the reflected wave of the source radio-frequency power RF. The RF power supply 31 determines the selected frequency to be the source frequency $f_{RF}$ for the phase period SP(n) in the subsequent cycle CY.

Second Example of Determining Source Frequencies $f_{RF}$

Figure 6:
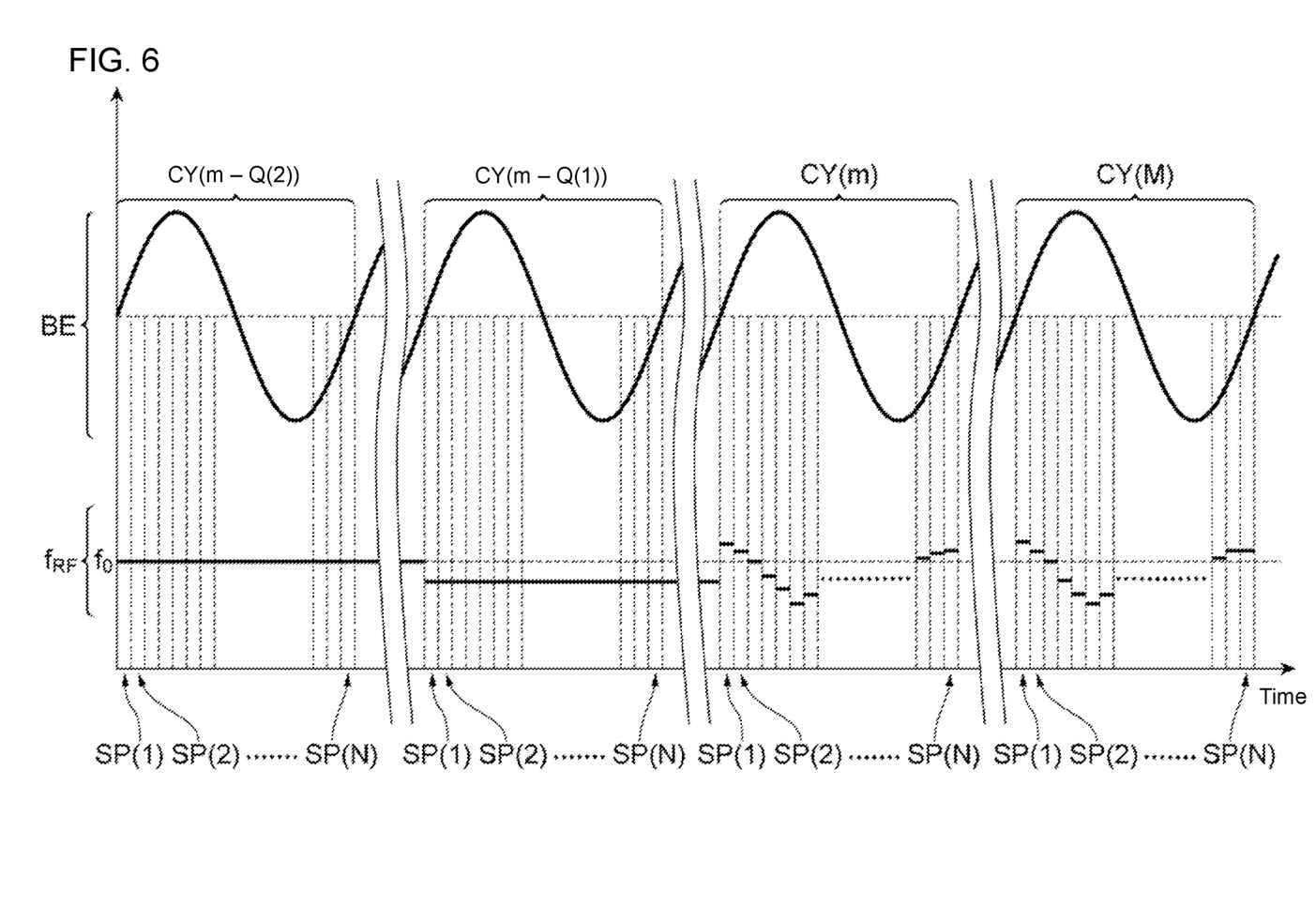
FIG. 6 is a timing chart for determining source frequencies in a second example.

FIG. 6 is a timing chart for determining source frequencies in a second example. As shown in FIG. 6, in the second example, the RF power supply 31 adjusts the source frequency $f_{RF}$ of the source radio-frequency power RF in the phase period SP(n) in the cycle CY(m), or the phase period SP(m, n), based on a change in the representative value RV(n). The change in the representative value RV(n) is identified by setting the frequency of the source radio-frequency power RF differently in the corresponding phase periods SP(n) in two or more cycles CY preceding the cycle CY(m).

The two or more cycles CY preceding the cycle CY(m) include a first cycle and a second cycle. In the example in FIG. 6, the first cycle is the cycle CY(m−Q(2)), and the second cycle is the cycle CY(m−Q(1)) subsequent to the first cycle. The value Q(1) is an integer greater than or equal to 1, the value Q(2) is an integer greater than or equal to 2, and Q(1)<Q(2).

The RF power supply 31 sets the frequency f(m−Q(1), n) of the source radio-frequency power RF in the phase period SP(m−Q(1), n) to a frequency resulting from a frequency shift in a first direction from the frequency of the source radio-frequency power RF in the phase period SP(m−Q(2), n). The symbol f(m, n) indicates the frequency of the source radio-frequency power RF in the phase period SP(m, n), and is expressed as f(m, n)=f(m−Q(1), n)+Δ(m, n), where Δ(m, n) is a frequency shift amount. The frequency shift in the first direction is either a decrease or an increase in the frequency. When the frequency shift in the first direction is a decrease in the frequency, the value Δ(m, n) is negative. When the frequency shift in the first direction is an increase in the frequency, the value Δ(m, n) is positive.

In FIG. 6, the multiple phase periods SP in the cycle CY(m−Q(2)) have the same frequency of the source radio-frequency power RF, or specifically, $f_0$, but may have different frequencies. In FIG. 6, the multiple phase periods SP in the cycle CY(m−Q(1)) have the same frequency of the source radio-frequency power RF, or specifically, a frequency decreased from $f_0$, but may have a frequency increased from $f_0$.

The RF power supply 31 identifies an increase or a decrease in the degree of reflection (e.g., the power level Pr of the reflected wave) of the source radio-frequency power RF resulting from the frequency shift based on a change between the representative value RV (m−Q(2), n) and the representative value RV (m−Q(1), n). When the degree of reflection of the source radio-frequency power RF decreases in response to a frequency shift in the first direction, the RF power supply 31 sets the frequency f(m, n) to a frequency resulting from a frequency shift in the first direction from the frequency f(m−Q(1), n).

The frequency shift amount Δ(m, n) in the first direction in the phase period SP(m, n) may be the same as the frequency shift amount Δ(m−Q(1), n) in the first direction in the phase period SP(m−Q(1), n). More specifically, the frequency shift amount Δ(m, n) may have the same absolute value as the frequency shift amount Δ(m−Q(1), n). In some embodiments, the frequency shift amount Δ(m, n) may have a greater absolute value than the frequency shift amount Δ(m−Q(1), n). In some embodiments, the frequency shift amount Δ(m, n) may have a greater absolute value for a greater degree of reflection in the phase period SP(m−Q(1), n). For example, the frequency shift amount Δ(m, n) may have the absolute value determined by a function of the degree of reflection.

The frequency shift in the first direction can increase the degree of reflection of the source radio-frequency power RF. In this case, the RF power supply 31 may set the frequency f(m, n) to a frequency resulting from a frequency shift in a second direction (the other of a decrease or an increase) from the frequency f(m−Q(1), n). The frequency of the source radio-frequency power RF in the phase period SP(n) in each of two or more cycles preceding the cycle CY(m) may be updated to be a frequency resulting from a frequency shift in the first direction from the frequency of the source radio-frequency power RF in the phase period SP(n) in its corresponding preceding cycle. In this case, for an upward trend of the degree of reflection of the source radio-frequency power RF in the phase periods SP(n) in the two or more cycles, the frequency of the source radio-frequency power RF in the phase period SP(n) in the cycle CY(m) may be set to a frequency resulting from a frequency shift in the second direction. For example, the frequency of the source radio-frequency power RF in the phase period SP(n) in the cycle CY(m) may be set to a frequency resulting from a frequency shift in the second direction from the frequency of the source radio-frequency power in the earliest of the two or more cycles.

When the degree of reflection of the source radio-frequency power RF in the phase period SP(m, n) increases from the degree of reflection of the source radio-frequency power RF in the phase period SP(m−Q(1), n) in response to a frequency shift in the first direction, the RF power supply 31 may set the frequency of the source radio-frequency power RF in the phase period SP(n) in the cycle CY(m+Q(1)) to an intermediate frequency. The cycle CY(m+Q(1)) is a third cycle subsequent to the cycle CY(m). The intermediate frequency that may be set in the phase period SP(m+Q(1), n) is between the frequencies f(m−Q(1), n) and f(m, n), and may be the average value of the frequencies f(m−Q(1), n) and f(m, n).

The degree of reflection of the source radio-frequency power RF (e.g., the power level Pr of the reflected wave) can exceed a predetermined threshold when the intermediate frequency is used in the phase period SP(m+Q(1), n). In this case, the RF power supply 31 may set the frequency of the source radio-frequency power RF in the phase period SP(n) in the cycle CY(m+Q(2)) to a frequency resulting from a frequency shift in the second direction from the intermediate frequency. The cycle CY(m+Q(2)) is a fourth cycle subsequent to the cycle CY(m+Q(1)). The threshold is predetermined. The frequency shift amount Δ(m+Q(2), n) in the second direction has a greater absolute value than the frequency shift amount Δ(m, n) in the first direction. This avoids the situation in which the amount of reflection of the source radio-frequency power RF fails to decrease from a local minimum value. The thresholds for the respective multiple phase periods SP in each of the multiple cycles CY may be the same as or different from one another.

In the second example, the frequencies of the source radio-frequency power RF that are set for the respective phase periods SP(1) to SP(N) in the cycle CY(M) are determined to be the source frequencies $f_{RF}$ for the respective phase periods SP(1) to SP(N).

Third Example of Determining Source Frequencies $f_{RF}$

In a third example, the source frequency $f_{RF}$ of the source radio-frequency power RF in each phase period SP in each cycle CY may be determined by adding a corresponding one of multiple frequency offsets to a reference frequency. Each of the multiple frequency offsets has a positive value or a negative value. The frequency offset that maximizes the power level of the source radio-frequency power RF to be transferred to the plasma is determined for each phase period SP. The power level of the source radio-frequency power RF to be transferred to the plasma may be the difference between the power level of the traveling wave and the power level of the reflected wave of the source radio-frequency power RF. The frequency offsets determined for the respective multiple phase periods SP are stored into a table. In each phase period SP in each cycle CY, the RF power supply 31 determines the source frequency $f_{RF}$ of the source radio-frequency power RF by adding the corresponding frequency offset stored in the table to the reference frequency.

Although the exemplary embodiments have been described above, the embodiments are not restrictive, and various additions, omissions, substitutions, and changes may be made. The components in the different embodiments may be combined to form another embodiment.

In other embodiments, the plasma processing apparatus may be an ICP plasma processing apparatus, an ECR plasma processing apparatus, an HWP plasma processing apparatus, or an SWP plasma processing apparatus. Any of these plasma processing apparatuses uses the source radio-frequency power RF to generate plasma.

Various exemplary embodiments E1 to E14 included in the disclosure will now be described.

E1

A plasma processing apparatus, comprising: a chamber;
a substrate support in the chamber;
a bias power supply electrically coupled to the substrate support, the bias power supply being configured to cyclically generate electrical bias energy having a bias frequency in bias cycles each having a duration being an inverse of the bias frequency;
a radio-frequency power supply electrically coupled to a radio-frequency electrode, the radio-frequency power supply being configured to generate source radio-frequency power to generate plasma from a gas in the chamber;
a first sensor configured to measure a power level of a reflected wave of the source radio-frequency power from a load; and
a second sensor configured to measure a voltage and a current on a feed line coupling the radio-frequency power supply and the radio-frequency electrode,
wherein the radio-frequency power supply identifies, from a plurality of phase periods in a bias cycle of the electrical bias energy, a phase period having a minimum value of the power level of the reflected wave, determines a reference value being a phase difference between the voltage and the current on the feed line in the identified phase period, and performs frequency control to set a source frequency of the source radio-frequency power for each of the plurality of phase periods based on a result of comparison between the reference value and the phase difference between the voltage and the current on the feed line in a corresponding phase period of the plurality of phase periods.

In embodiment E1, the reference value is determined to be the phase difference between the voltage and the current in the phase period having the minimum value of the power level of the reflected wave. In other words, the reference value is determined to be the phase difference corresponding to the lowest level of the reflected wave that may contain intermodulation distortion components or harmonic components. In each of the plurality of phase periods, the source frequency is adjusted based on the result of comparison between the reference value and the phase difference between the voltage and the current. This reduces the power level of the reflected wave of the source radio-frequency power.

E2
The plasma processing apparatus according to E1, wherein
in each of the plurality of phase periods, the frequency control increases the source frequency when the phase difference between the voltage and the current on the feed line is greater than the reference value and decreases the source frequency when the phase difference is less than the reference value.

E3
The plasma processing apparatus according to E1 or E2, wherein
in each of the plurality of phase periods, the radio-frequency power supply adjusts the source frequency through the frequency control by an adjustment amount determined based on an absolute value of a difference between the reference value and the phase difference.

E4
The plasma processing apparatus according to any one of E1 to E3, wherein
in each of the plurality of phase periods, the radio-frequency power supply performs the frequency control when the power level of the reflected wave is greater than a threshold.

E5
The plasma processing apparatus according to E4, wherein
the radio-frequency power supply decreases the threshold when power levels of the reflected wave obtained by the first sensor in the respective plurality of phase periods are all less than or equal to the threshold in a bias cycle of the electrical bias energy.

E6
The plasma processing apparatus according to any one of E1 to E5, wherein
the radio-frequency power supply includes
a signal generator configured to generate a radio-frequency signal, and an amplifier configured to amplify the radio-frequency signal to generate the source radio-frequency power, and
the signal generator identifies the phase period having the minimum value of the power level of the reflected wave, determines the reference value, and generates the radio-frequency signal having the source frequency adjusted through the frequency control for each of the plurality of phase periods.

E7
The plasma processing apparatus according to any one of E1 to E6, wherein
the electrical bias energy includes bias radio-frequency power having the bias frequency or a pulse of a voltage cyclically generated at a time interval being the inverse of the bias frequency.

E8
The plasma processing apparatus according to any one of E1 to E7, wherein
the plasma processing apparatus is a capacitively coupled plasma processing apparatus, and
the radio-frequency electrode is in the substrate support or is an upper electrode above the substrate support.

E9
A power supply system, comprising:
a bias power supply configured to cyclically generate, in bias cycles, electrical bias energy to be provided to a substrate support in a chamber in a plasma processing apparatus, the electrical bias energy having a bias frequency, each of the bias cycles having a duration being an inverse of the bias frequency; and
a radio-frequency power supply configured to generate source radio-frequency power to be provided to a radio-frequency electrode to generate plasma from a gas in the chamber,
wherein the radio-frequency power supply identifies, from a plurality of phase periods in a bias cycle of the electrical bias energy, a phase period having a minimum value of a power level of a reflected wave of the source radio-frequency power, determines a reference value being a phase difference between a voltage and a current on a feed line between the radio-frequency power supply and the radio-frequency electrode in the identified phase period, and performs frequency control to set a source frequency of the source radio-frequency power for each of the plurality of phase periods based on a result of comparison between the reference value and the phase difference between the voltage and the current on the feed line in a corresponding phase period of the plurality of phase periods.

E10
The power supply system according to E9, wherein
in each of the plurality of phase periods, the frequency control increases the source frequency when the phase difference between the voltage and the current on the feed line is greater than the reference value and decreases the source frequency when the phase difference is less than the reference value.

E11
A control method, comprising:
(a) cyclically providing, in bias cycles, electrical bias energy having a bias frequency from a bias power supply to a substrate support in a chamber in a plasma processing apparatus, each of the bias cycles having a duration being an inverse of the bias frequency;
(b) providing source radio-frequency power from a radio-frequency power supply to a radio-frequency electrode to generate plasma from a gas in the chamber;
(c) identifying, from a plurality of phase periods in a bias cycle of the electrical bias energy, a phase period having a minimum value of a power level of a reflected wave of the source radio-frequency power from a load;
(d) determining a reference value being a phase difference between a voltage and a current on a feed line coupling the radio-frequency power supply and the radio-frequency electrode in the phase period identified in (c); and
(e) performing frequency control to set a source frequency of the source radio-frequency power for each of the plurality of phase periods based on a result of comparison between the reference value and the phase difference between the voltage and the current on the feed line in a corresponding phase period of the plurality of phase periods.

E12

The control method according to E11, wherein
in each of the plurality of phase periods, the frequency control increases the source frequency when the phase difference between the voltage and the current on the feed line is greater than the reference value and decreases the source frequency when the phase difference is less than the reference value.

E13

A program executable by a computer in a plasma processing apparatus to implement the control method according to E11 or E12 with the plasma processing apparatus.

E14

A storage medium storing the program according to E13.

The exemplary embodiments according to the disclosure have been described by way of example, and various changes may be made without departing from the scope and spirit of the disclosure. The exemplary embodiments described above are thus not restrictive, and the true scope and spirit of the disclosure are defined by the appended claims.

REFERENCE SIGNS LIST

1 Plasma processing apparatus
10 Chamber
11 Substrate support
30 Power supply system
31 RF power supply
32 Bias power supply
35 Sensor
36 Sensor

The invention claimed is:

1. A plasma processing apparatus, comprising:
a chamber;
a substrate support in the chamber;
a bias power supply electrically coupled to the substrate support, the bias power supply being configured to cyclically generate electrical bias energy having a bias frequency in bias cycles, each of the bias cycles having a duration being an inverse of the bias frequency;
a radio-frequency power supply electrically coupled to a radio-frequency electrode;
a first sensor configured to measure a power level of a reflected wave of the source radio-frequency power from a load; and
a second sensor configured to measure a voltage and a current on a feed line coupling the radio-frequency power supply and the radio-frequency electrode,
wherein the radio-frequency power supply is configured to:
generate source radio-frequency power to generate plasma from a gas in the chamber,
identify, from a plurality of phase periods in one of the bias cycles of the electrical bias energy, a phase period having a minimum value of the power level of the reflected wave,
determine a reference value being a phase difference between the voltage and the current on the feed line in the identified phase period, and
perform frequency control to set a source frequency of the source radio-frequency power for each of the plurality of phase periods based on a result of comparison between the reference value and the phase difference between the voltage and the current on the feed line in a corresponding phase period of the plurality of phase periods.

2. The plasma processing apparatus according to claim 1, wherein in each of the plurality of phase periods, the radio-frequency power supply is configured to perform frequency control to increase the source frequency when the phase difference between the voltage and the current on the feed line is greater than the reference value and to decrease the source frequency when the phase difference is less than the reference value.

3. The plasma processing apparatus according to claim 1, wherein in each of the plurality of phase periods, the radio-frequency power supply is configured to adjust the source frequency through the frequency control by an adjustment amount determined based on an absolute value of a difference between the reference value and the phase difference.

4. The plasma processing apparatus according to claim 1, wherein in each of the plurality of phase periods, the radio-frequency power supply is configured to perform the frequency control when the power level of the reflected wave is greater than a threshold.

5. The plasma processing apparatus according to claim 4, wherein the radio-frequency power supply is configured to decrease the threshold when power levels of the reflected wave obtained by the first sensor in the respective plurality of phase periods are all less than or equal to the threshold in a bias cycle of the electrical bias energy.

6. The plasma processing apparatus according to claim 1, wherein:
the radio-frequency power supply includes:
a signal generator configured to generate a radio-frequency signal; and
an amplifier configured to amplify the radio-frequency signal to generate the source radio-frequency power, and
the signal generator is configured to:
identify the phase period having the minimum value of the power level of the reflected wave,
determine the reference value, and
generate the radio-frequency signal having the source frequency adjusted through the frequency control for each of the plurality of phase periods.

7. The plasma processing apparatus according to claim 1, wherein the electrical bias energy includes bias radio-frequency power having the bias frequency or a pulse of a voltage cyclically generated at a time interval being the inverse of the bias frequency.

8. The plasma processing apparatus according to claim 1, wherein:
the plasma processing apparatus is a capacitively coupled plasma processing apparatus, and
the radio-frequency electrode is in the substrate support or is an upper electrode above the substrate support.

9. A power supply system, comprising:
a bias power supply configured to cyclically generate, in bias cycles, electrical bias energy to be provided to a substrate support in a chamber in a plasma processing apparatus, the electrical bias energy having a bias frequency, each of the bias cycles having a duration being an inverse of the bias frequency; and
a radio-frequency power supply configured to:
generate source radio-frequency power to be provided to a radio-frequency electrode to generate plasma from a gas in the chamber,
identify from a plurality of phase periods in one of the bias cycles of the electrical bias energy, a phase period having a minimum value of a power level of a reflected wave of the source radio-frequency power, determine a reference value being a phase difference between a voltage and a current on a feed line between the radio-frequency power supply and the radio-frequency electrode in the identified phase period, and perform frequency control to set a source frequency of the source radio-frequency power for each of the plurality of phase periods based on a result of comparison between the reference value and the phase difference between the voltage and the current on the feed line in a corresponding phase period of the plurality of phase periods.

10. The power supply system according to claim 9, wherein in each of the plurality of phase periods, the radio-frequency power supply is configured to perform the frequency control to increase the source frequency when the phase difference between the voltage and the current on the feed line is greater than the reference value and decrease the source frequency when the phase difference is less than the reference value.

11. The power supply system of claim 9, wherein in each of the plurality of phase periods, the radio-frequency power supply is configured to adjust the source frequency through the frequency control by an adjustment amount determined based on an absolute value of a difference between the reference value and the phase difference.

12. The power supply system of claim 9, wherein in each of the plurality of phase periods, the radio-frequency power supply is configured to perform the frequency control when the power level of the reflected wave is greater than a threshold.

13. The power supply system of claim 12, wherein the radio-frequency power supply is configured to decrease the threshold when power levels of the reflected wave obtained by the first sensor in the respective plurality of phase periods are all less than or equal to the threshold in a bias cycle of the electrical bias energy.

14. The power supply system of claim 9, wherein:
the radio-frequency power supply includes:
 a signal generator configured to generate a radio-frequency signal; and
 an amplifier configured to amplify the radio-frequency signal to generate the source radio-frequency power, and
the signal generator is configured to:
 identify the phase period having the minimum value of the power level of the reflected wave,
 determine the reference value, and
 generate the radio-frequency signal having the source frequency adjusted through the frequency control for each of the plurality of phase periods.

15. The power supply system of claim 9, wherein the electrical bias energy includes bias radio-frequency power having the bias frequency or a pulse of a voltage cyclically generated at a time interval being the inverse of the bias frequency.

16. A control method, comprising:
(a) cyclically providing, in bias cycles, electrical bias energy having a bias frequency from a bias power supply to a substrate support in a chamber in a plasma processing apparatus, each of the bias cycles having a duration being an inverse of the bias frequency;
(b) providing source radio-frequency power from a radio-frequency power supply to a radio-frequency electrode to generate plasma from a gas in the chamber;
(c) identifying, from a plurality of phase periods in a bias cycle of the electrical bias energy, a phase period having a minimum value of a power level of a reflected wave of the source radio-frequency power from a load;
(d) determining a reference value being a phase difference between a voltage and a current on a feed line coupling the radio-frequency power supply and the radio-frequency electrode in the phase period identified in (c); and
(e) performing frequency control to set a source frequency of the source radio-frequency power for each of the plurality of phase periods based on a result of comparison between the reference value and the phase difference between the voltage and the current on the feed line in a corresponding phase period of the plurality of phase periods.

17. The control method according to claim 16, wherein in each of the plurality of phase periods, the frequency control increases the source frequency when the phase difference between the voltage and the current on the feed line is greater than the reference value and decreases the source frequency when the phase difference is less than the reference value.

18. The control method of claim 16, wherein:
the radio-frequency power supply includes:
 a signal generator configured to generate a radio-frequency signal; and
 an amplifier configured to amplify the radio-frequency signal to generate the source radio-frequency power, and
the method further includes, by the signal generator:
 identifying the phase period having the minimum value of the power level of the reflected wave;
 determining the reference value; and
 generating the radio-frequency signal having the source frequency adjusted through the frequency control for each of the plurality of phase periods.

19. A non-transitory computer readable storage medium storing computer executable program code that, when run on circuitry of a power supply system, causes the circuitry to perform the control method of claim 16.

20. The non-transitory computer readable storage medium of claim 19, further including executable program code that, when run on the circuitry of the power supply system, causes the circuitry to perform the control method of claim 17.

* * * * *